(12) United States Patent
Alakuijala

(10) Patent No.: US 8,175,403 B1
(45) Date of Patent: May 8, 2012

(54) ITERATIVE BACKWARD REFERENCE SELECTION WITH REDUCED ENTROPY FOR IMAGE COMPRESSION

(75) Inventor: Jyrki Alakuijala, Adliswil (CH)

(73) Assignee: Google Inc., Mountain View, CA (US)

(*) Notice: Subject to any disclaimer, the term of this patent is extended or adjusted under 35 U.S.C. 154(b) by 983 days.

(21) Appl. No.: 12/134,182

(22) Filed: Jun. 5, 2008

(51) Int. Cl.
*G06K 9/46* (2006.01)

(52) U.S. Cl. ...... 382/246

(58) Field of Classification Search ...... 382/232–253
See application file for complete search history.

(56) References Cited

U.S. PATENT DOCUMENTS

| | | | |
|---|---|---|---|
| 5,805,735 A | | 9/1998 | Chen et al. |
| 6,415,054 B1 * | | 7/2002 | Silverbrook et al. ...... 382/233 |
| 7,849,377 B2 * | | 12/2010 | Hekstra et al. ...... 714/752 |
| 2004/0086039 A1 * | | 5/2004 | Reynolds et al. ...... 375/240.01 |
| 2006/0056728 A1 * | | 3/2006 | Silverbrook et al. ...... 382/276 |
| 2007/0006150 A9 * | | 1/2007 | Walmsley ...... 717/120 |
| 2011/0037776 A1 * | | 2/2011 | Hardebeck et al. ...... 345/600 |
| 2011/0043531 A1 * | | 2/2011 | Ichieda ...... 345/522 |

* cited by examiner

*Primary Examiner* — Jingge Wu
(74) *Attorney, Agent, or Firm* — Fenwick & West LLP

(57) ABSTRACT

A system (and a method) are disclosed for optimizing lossless data compression in digital images systems iteratively. The system includes a backward reference module and an entropy encoder. The backward reference module comprises three sub-modules: a backward reference selection module, a backward reference statistics measurement module and a backward reference selection control module. The backward reference selection module initially selects backward references that have shorter backward distances. The statistics measurement module analyzes the backward references of input data. The backward reference selection module updates the backward references based on the statistics of previously generated backward references at subsequent selection iterations. The backward reference selection control module controls the number of selection iterations needed for optimized data compression performance.

34 Claims, 3 Drawing Sheets

ITERATIVE BACKWARD REFERENCE SELECTION WITH REDUCED ENTROPY FOR IMAGE COMPRESSION

BACKGROUND OF THE INVENTION

1. Field of the Invention

The present invention relates generally to lossless data compression, and more particularly to a method for iteratively reducing entropy of backward references in lossless data compression.

2. Background

Existing lossless byte stream compression techniques, such as the Deflate data compression algorithm, incorporate commonly occurring patterns in source input data in order to increase amount of compression. Lossless compression techniques may be categorized according to the type of source input data they are designed to compress. It is known that no lossless compression technique can efficiently compress all possible types of input data and that completely random input data streams cannot be compressed. For this reason, many different lossless byte stream compression techniques exist that are designed either with a specific type of input data in mind or with specific assumptions about what kinds of redundancy the source input data are likely to contain. For example, LZ77-based Deflate algorithm used by gzip is a part of compression process of Portable Network Graphics (PNG) and HTTP. For multimedia compression, discrete wavelet transform based JPEG and JEPG2000 algorithms take advantage of the specific characteristics of input images, such as the common phenomenon of contiguous two-dimensional areas of similar pixel values.

A typical lossless byte stream compression method, such as Deflate data compression algorithm, consists of two compression phases: backward reference selection followed by entropy coding, such as Huffman coding. The backward reference selection phase selects a backward reference for each block of uncompressed data elements so as to result in reduced entropy of the backward reference. A backward reference, i.e., a match, found at the backward reference selection phase, is typically described by a tuple (d, l), where d is backward reference distance from a search point to the data element in an input stream following the match, and l is the length of the backward reference. The entropy coding phase encodes source input data elements and backward references. In the backward reference selection phase, the backward references of the input data constitute a statistical model, or measurement, of the input data. The entropy coding phase maps the input data to bit sequences using this statistical model in such a way that frequently encountered data, i.e., "probable data", will produce shorter bit sequences than "improbable data".

Conventional backward reference selection algorithm in a Deflate implementation, like zlib, favors a backward reference with smaller backward distance among multiple available backward references. This approach is satisfactory when used for compression specific data files where there is some priori knowledge about the data files, such as statistics of backward distances distribution. To achieve fast data compression, this approach generally does not iteratively apply the backward reference selection algorithm to input data so as to generate a more accurate statistical model or measurement of the input data. However, a more accurate statistical model of the input data greatly enhances the entropy encoding performance by generating more compact entropy codes of the input data. As result, backward reference selection without taking into consideration the statistics of source input data is limited, and thus tends to increase entropy code length of source input data and backward references. Improvements that are compatible to the current lossless byte stream compression method can thus lead to significant savings in both data transfer bandwidth costs and persistent storage of data.

SUMMARY

A system and method selects a backward reference for each block of uncompressed data elements so as to result in reduced entropy of the backward reference through controlled backward reference selection iterations. A backward references selection module may be configured to select backward references that have shorter backward reference distances among multiple references with same backward reference length at initial iteration. A backward reference statistics measurement module is configured to collect and analyze backward references generated at each selection iteration. The backward reference selection module is also configured to update a backward reference selection at a subsequent selection iteration using the statistics of the backward references generated at a previous selection iteration. At each selection iteration, the backward references selected leads to reduced entropy code lengths of the backward references than previous iteration. A backward reference selection control module is configured to control the number of selection iterations for optimized data compression.

The backward reference selection module, the statistic measurement module and the selection control module may be alternatively configured to balance the efficiency of backward references selection and computational requirements. The selection control module is configured to have one iteration of a backward reference selection process, which is less computationally expensive than multiple iterations of backward references. The statistic measurement module is configured to build the statistics of backward references incrementally, where the statistics of backward references include only the backward references data that has been processed so far. The backward reference selection module is configured to select backward references based on the incrementally updated statistics.

The backward reference selection module, the statistic measurement module and the selection control module may be additionally or alternatively configured to optimize Deflate compression performance. These various embodiments of the backward references modules allow an improved compression ratio for lossless data compression.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the disclosed subject matter.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Figure 1:
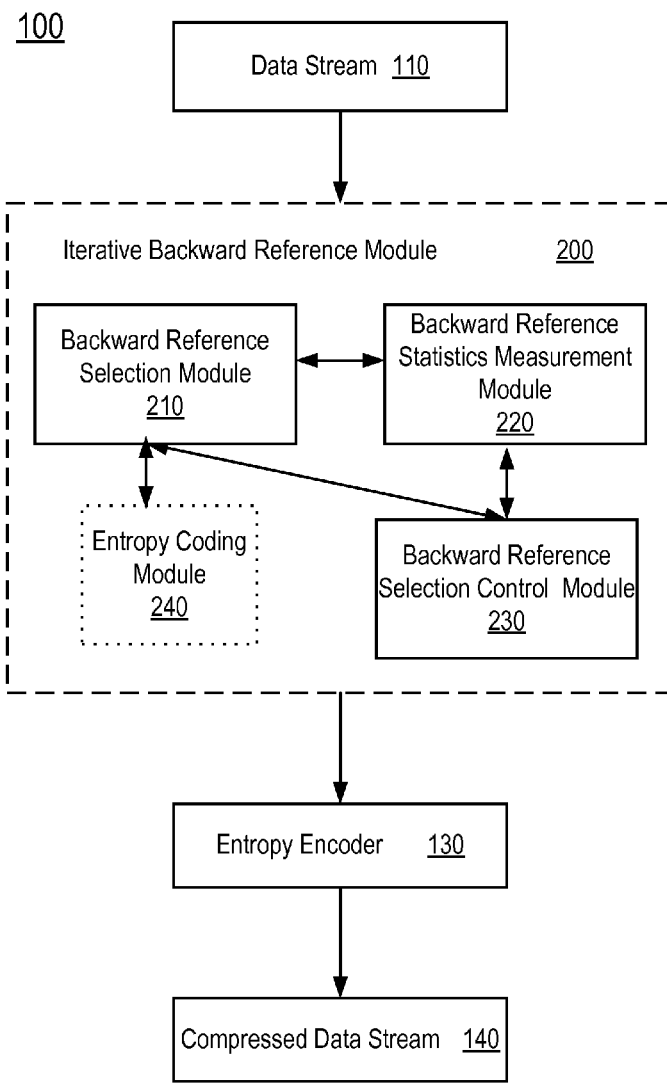
FIG. 1 is a block diagram illustrating a system having an iterative backward reference module according to one embodiment.

FIG. 1 is a block diagram illustrating a compression system 100 having an iterative backward reference module 200 according to one embodiment. In the example embodiments described below, the system 100 comprises an iterative backward reference module 200 and an entropy encoder 130. The system 100 also comprises a data stream 110 and a compressed data stream 140. The system 100 stores the data stream 110 in an input stream buffer (not shown in FIG. 1) and the compressed data stream 140 in an output stream buffer (not shown in FIG. 1). The iterative backward reference module 200 has three sub-modules: a backward reference selection module 210, a backward reference statistics measurement module 220 and a backward reference selection control module 230. The iterative backward reference module 200 reads the data stream 110, selects an optimized backward reference for a plurality of data elements of the data stream 110 through the sub-modules, 210-230, and stores the backward reference in a reference buffer (not shown in FIG. 1). The entropy encoder 130 receives backward references of the data stream 110, and entropy encodes the backward references and the data stream 110 into the compressed data stream 140. This compressed data can then be stored on a computer readable medium, or transmitted over a computer network. In other embodiments, the iterative backward reference module 200 may also include an entropy coding module 240 to further facilitate backward reference selection.

The data stream 110 comprises blocks of raw (i.e., uncompressed) input data elements in an uncompressed format. In one embodiment, the raw input data is multi-dimensional and multi-component, such as truecolor PNG image signal, where each data element has one or more data components, and each data component has a known size. For example, a truecolor multi-component PNG image signal is represented by a data element with three data components representing red, green, and blue color. For a data component of one byte long, the size of a PNG truecolor data element is thus 3 bytes. In other embodiments, no prior knowledge of the raw input data exits or is assumed before input data being compressed. Thus, the raw input data is any generic input data type that needs compression, such as text files and multimedia image files.

The iterative backward reference module 200 receives the data stream 110 without prior knowledge or assumption of the data stream 110, and through a controlled number of backward reference selection iterations, the iterative backward reference module 200 selects at each selection iteration a backward reference for each block of data elements being compressed, and refines the backward references at subsequent selection iterations, leading to dense compression of the data stream 110. Specifically, the iterative backward reference module 200 generates a set of backward references of the data stream 110 and a corresponding set of measurement statistics of the backward references at current selection iteration. At next selection iteration, the iterative backward reference module 200 uses the measurement statistics generated at the current iteration to update the backward references of the data stream 110 so that the entropy of backward references selected at the next selection iteration is lesser than the current selection iteration.

The entropy encoder 130 receives a backward reference for each block of data elements processed by the iterative backward reference module 200, and builds variable length code tables for encoding data elements of the data stream 110. A typical entropy encoder 130 may be implemented by Huffman coding. The entropy encoder 130 preferably contains two Huffman code tables, one for encoding data element symbols, i.e., literals, and backward reference lengths and/or backward reference length prefixes, and the other code table for encoding backward reference distances and/or backward reference distance prefixes. Those skilled in the art will recognize that Huffman coding is used only by way of example and that a variety of other entropy encoding schemes may be used.

Referring back to the iterative backward reference module 200 illustrated in FIG. 1, the iterative backward reference module 200 iteratively finds backward references for blocks of uncompressed data elements with reduced entropy of backward references at each iteration. The backward reference selection module 210 applies a backward reference selection algorithm to the data stream 110 and selects a backward reference for each block of data elements of the data stream 110 at current selection iteration. The backward reference statistics measurement module 220 measures the statistics of the backward references of the data stream 110, and sends the measurement statistics to the backward reference selection module 210 and the backward reference selection control module 230. The backward reference selection control module 230, guided by the measurement statistics of current selection iteration, determines whether a new selection iteration is needed. Responsive to a determination of a new selection iteration being needed, the backward reference selection module 210 updates, in next selection iteration, the backward references selected from current selection iteration, and generates a set of updated backward references of the data stream 110. The backward reference statistics measurement module 220 generates a new set of measure statistics of the updated backward references, and sends the measurement statistics to the backward reference selection module 210 and the backward reference selection control module 230. The similar selection iteration process described above continues until the backward reference selection control module 230 decides that the iterative backward reference selection process for the data stream 110 is completed.

The backward reference selection module 210 uses a backward reference selection algorithm at an initial selection iteration, followed by an updated backward reference selection algorithm at subsequent selection iterations. The backward reference selection algorithm, in one embodiment, is a conventional LZ77-based Deflate algorithm used in zlib implementation. Other backward reference selection algorithms may be used in other embodiments, such as optimized backward reference selection with reduced entropy as described in U.S., patent application Ser. No. 12/014,964, which is incorporated by reference in its entirety herein.

At the initial iteration, for each block of uncompressed data elements, the backward reference selection module 210 favors a backward reference with longest matching data elements and shorter distance if multiple backward references are available. To optimize the backward reference selection, the backward reference selection module 210 may take into consideration the individual data components of input data stream. For example, the backward reference selection module 210 may be configured to select backward references for which the backward reference distances and/or lengths are an integer of multiple of the size of the data element. Other backward reference selection algorithms are readily to be used in light of this specification.

At subsequent iterations, for each block of uncompressed data elements, the backward reference selection module 210 updates the backward reference generated from the previous iteration using the measurement statistics of the backward references generated from the previous iteration. For example, the backward reference selection module 210 re-applies the backward reference selection algorithm to the data stream 110 at a subsequent selection iteration, but favors backward references that are more common in the backward references of the data stream 110.

To further illustrate how the backward reference selection module 210 selects backward references using measurement statistics of previously generated backward references, the following is an example of the backward reference selection module 210 works through multiple iterations on an input signal. Table I lists the backward reference data of the input signal generated from the initial backward reference selection iteration.

TABLE I

Initial Backward Reference Data

| Line | Input Data | Initial Backward Reference (d, l) | |
|---|---|---|---|
| | | Distance (d) | Length (l) |
| 1 | 0123456789 | N/A | N/A |
| 2 | 0123456789 | −10 | 10 |
| 3 | 0123456789 | −10 | 10 |
| 4 | 0123456789 | −10 | 10 |
| 5 | 0000056789 | −1 | 4 |
| | | −10 | 5 |
| 6 | 0003456789 | −8 | 3 |
| | | −9 | 3 |
| | | −10 | 3 |

The exemplary input signal is six lines of numeric values to be compressed. A backward reference selection algorithm, e.g., a conventional LZ77-based Deflate algorithm, is applied to the input signal by the backward reference selection module 210. For the first line of input signal, no backward reference is found and the input signal content, i.e., "literals" ("0123456789"), is to be entropy encoded. For input data at lines 2 to 4, each line of data has a longest match found at its respective previous line. For example, for line 2 data, "0123456789", the longest match is 10 in length and found at line 1, which is 10 elements away from the start of the line 2 input data element "0". The negative sign represents the searching direction is "backwards" from the most recently compressed data elements to the less recently compressed data elements in a backward reference searching buffer. Similarly, line 4 data has a backward reference tuple (−10, 10) found at the previous line, line 3. However, for line 5 and line 6 input data, there are multiple possible backward references available. For example, for line 6 input data, to encode the three leading "0"s, a possible backward reference is located at line 5 with a distance of −8 and length of 3, a distance of −9 and a length of 3, or a distance of −10 and a length of 3.

According to conventional backward reference selection algorithm, the backward reference selection module 210 would select the backward reference tuple (−8, 3) for three 0s in the beginning of line 6 data due to smaller reference distance compared to alternative backward reference tuples, (−9, 3) and (−10, 3). However, from the backward references data for the six-line input signal, it shows that the literals "0123456789" repeat four times in the input signal, making a backward reference of −10 more common in the backward reference data. Following the conventional approach of simply favoring backward references with shorter backward distances, the backward reference tuple (−8, 3) over (−10, 3) in this example, would result in a larger entropy code length of coding the backward reference because the backward reference tuple (−8, 3) is less probable statistically among the backward references of the input signal. In contrast, the backward reference tuple (−10, 3) is more probable statistically and thus, leads to smaller entropy value of coding the tuple. In light of the above analysis, the backward reference selection module 210 selects the backward reference tuple (−10, 3) for line 6 input data.

To facilitate backward reference selections at subsequent selection iterations, the backward reference statistics measurement module 220 collects and measures the backward references data of input data to obtain a backward reference statistics measurement. The purpose of the backward reference statistics measurement is to provide a statistical model of the distribution of backward references of the input data. The backward reference statistics measurement module 220 may simply count the number of repetitions of a block of input data. Using the Table I data as an example, the backward reference statistics measurement module 220 finds that for input data block "0123456789", the count of repetitions is four out of six total lines of input signal. The backward reference statistics measurement module 220 may also count the number of repetitions for each block of input data and its associated backward reference distance and length. Other statistical data analysis algorithms and/or tools are readily available for those of ordinary skills in the art. The measurement statistics of the backward reference data generated at each iteration by the backward reference statistics measurement module 200 is sent to the backward reference selection module 210 and the backward reference selection control module 230 for further processing.

The backward reference selection control module 230 controls the number of selection iterations needed to refine the backward references of the input data. The purpose of multiple selection iterations of backward reference selection process is to reduce the entropy of the backward references and input data at each iteration. The number of selection iterations to refine the backward references of the input data is a design choice in various embodiments. For example, if a compression system has sufficient computer power and CPU time consumption is a less important performance factor, the number of selection iterations to minimize entropy may be arbitrarily large. In other scenarios when computation power is limited, a smaller number of selection iterations, such as 9 selection iterations, may be needed to balance the tradeoff between compression efficiency and compression quality. The backward reference selection control module 230 may use an iteration counter for the number of selection iterations needed. At end of each backward reference selection process by the backward reference selection module 210, the backward reference selection control module 230 decrements the iteration counter by one. The backward reference selection iteration ends when the iteration counter reaches zero.

The number of selection iterations may be influenced by other performance factors, such as the statistics of the backward reference data, size of computer storage medium, network bandwidth and type of input data. For example, a backward reference distribution model built by the backward reference statistics measurement module 220 indicates how many repetitions of each backward reference distance. After some selection iterations, among two different backward references of equal reference length, the backward reference distribution model indicates that one backward reference has a larger count of repetitions than the other one. This indicates that the backward reference having the larger count of repetitions is more widely distributed than the other one. Responsively, the backward reference selection control module 230 instructs the backward reference selection module 210 to re-apply the backward reference selection algorithm to the input data favoring the backward reference with the larger count of repetitions.

To balance the efficiency of backward references selection and the computational requirements for performing backward references selection, the number of selection iterations may be set to one (hence, a single interation), which requires less computational power with a slight efficiency reduction compared to multiple selection iterations. The statistic measurement module is configured to build the statistics of backward references incrementally, where the statistics of backward references include only the backward references data that has been processed so far. The backward reference selection module is configured to select backward references based on the incrementally updated statistics.

Figure 2:
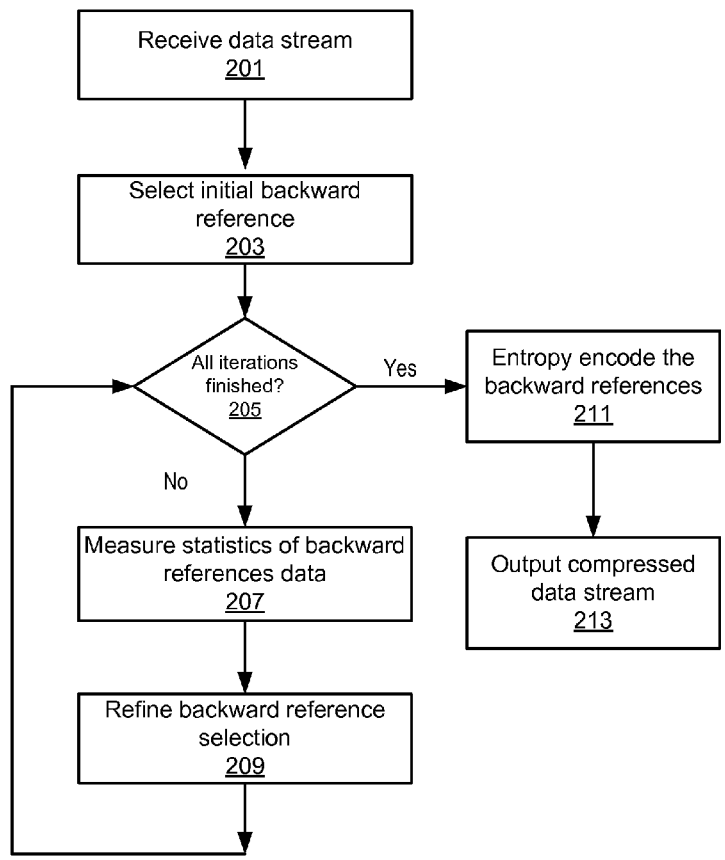
FIG. 2 is a flowchart showing a method of using an iterative backward reference module according to one embodiment.

FIG. 2 is a flowchart showing a method of using an iterative backward reference module 200 according to one embodiment. Initially, the iterative backward reference module 200 receives 201 an input data stream to be compressed. The backward reference selection module 210 selects 203 backward references for the input data stream at an initial selection iteration. The backward references selection module 210 generally favors backward references with smaller distances among multiple backward reference choices at the initial selection iteration. The backward reference selection control module 230 checks 205 if a predetermined number of selection iterations are finished. In response to more selection iterations being needed, the backward reference statistics measurement module 220 collects and the measures 207 the statistics of the backward references of the input data stream. The backward reference selection module 210, guided by the measurement statistics of the backward references, refines 209 the backward references of the input data stream at a subsequent selection iteration. The backward reference selection module 210 favors backward references which are common in the backward references at the subsequent selection iteration. The backward reference selection control module 220 checks again 205 whether all predetermined selection iterations are finished. Responsive to all selection iterations being performed, the backward reference module 200 sends the backward references and input data stream to the entropy encoder 130 for further process. The entropy encoder 130 entropy encodes 211 the backward references and other related data, and outputs 213 the compressed data stream to a data storage medium or network for transmission over a computer network.

To work efficiently with Deflate compression algorithms, the iterative backward reference module 200 is configured to reduce the entropy of the prefix codes of backward reference distances and lengths. The Deflate compression standard only specifies Huffman codes to entropy encode backward reference distance prefix and length prefix. The backward reference distance and length values themselves do not have their corresponding Huffman codes. A backward reference distance/length without Huffman code is referred to as non-prefixed backward reference distance/length for the simplicity of the description of an embodiment from herein. To generate the backward reference distances and lengths prefix codes, the backward reference module 200 may also comprise an entropy encoding module to encode the backward references at each iteration after selection process. The backward reference statistics measurement module 220 collects and measures the backward references including backward reference distance and length prefix data.

To take into account the bit cost of the non-prefixed backward reference bits for backward reference selection, the backward reference selection module 210 is configured to evaluate the bit cost of entropy encoding the backward reference prefix with respect to the bit cost of its corresponding non-prefix backward reference using the formula below, $$f(\text{prefix}) = \log_2[\text{count}(\text{prefix})] - \text{bits}[\text{non\_Huffman}(\text{prefix})] \quad (1)$$

where prefix is a backward reference prefix, e.g. distance prefix or length prefix, being evaluated; count(prefix) represents the number of backward references having such backward reference prefix in the input data stream; $\log_2$ [count (prefix)] approximates the bit cost of entropy encoding the backward reference prefix, and bits[non_Huffman(prefix)] is the number of non-entropy encoded bits of the backward reference (e.g., distance or length). The resulting evaluation, i.e., f (prefix), for each backward reference, represents a preference order of selecting this backward reference prefix. Thus, the bit cost evaluation enables the backward reference selection module 210 to select a backward reference that leads to reduced entropy of the backward reference. For example, from the evaluation result of each backward reference distance of the backward reference distances, the backward reference selection module 210 is able to select backward distance entropy codes in a preferred order which the selection order corresponds to the most minimized entropy to least minimized entropy of the backward reference distance.

Figure 3:
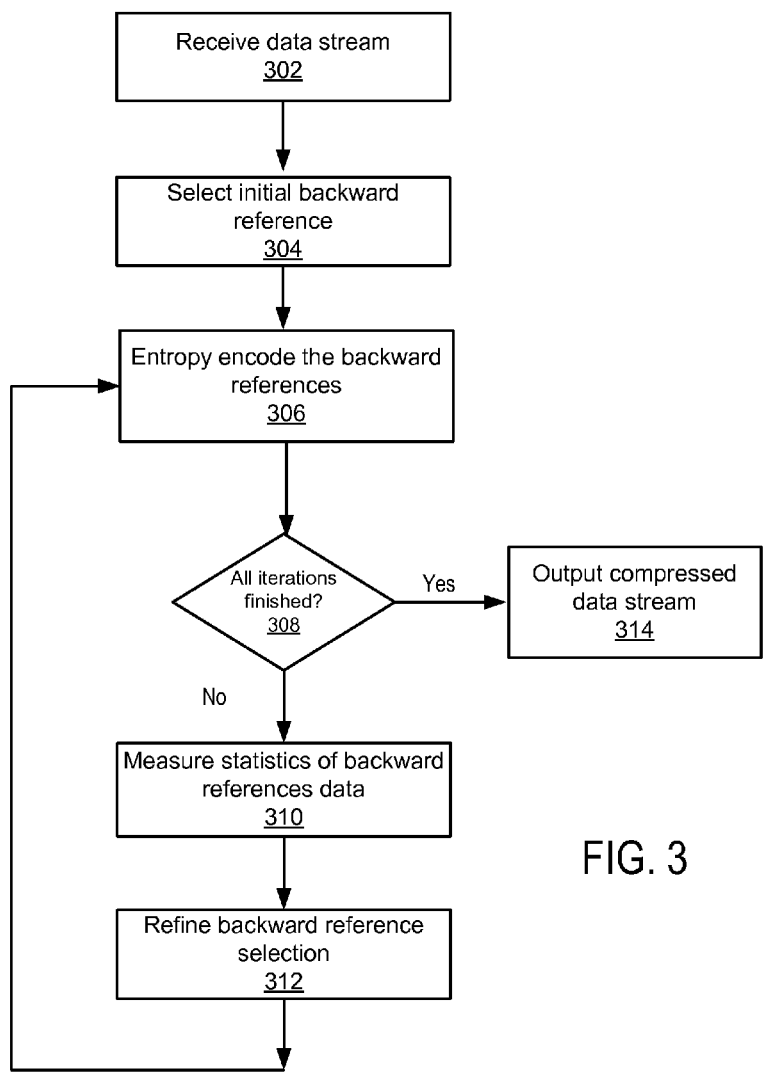
FIG. 3 is a flowchart showing a method of using an iterative backward reference module with Deflate implementation according to one embodiment.

FIG. 3 is a flowchart showing a method of using an iterative backward reference module 200 with Deflate implementation according to one embodiment. It is assumed that an entropy coding module 240 is available for the iterative backward reference module 200. Other embodiments perform different and/or additional steps than the ones described here. Moreover, other embodiments perform the steps in different order than that described below.

Initially, the iterative backward reference selection module 200 receives 302 input data stream to be compressed. The backward reference selection module 210 selects 304 backward references for the input data stream at an initial selection iteration. The backward references selection module 210 generally favors backward references with smaller distances among multiple backward reference choices at the initial selection iteration. The entropy coding module 240 encodes 306 the backward references generated at the initial selection iteration. The backward reference statistics measurement module 220 collects and measures the backward references including the distance and length prefix data. The backward reference selection control module 230 checks 308 if a predetermined number of selection iterations are finished. In response to more selection iterations being needed, the backward reference statistics measurement module 220 collects and the measures 310 the statistics of the backward references of the input data stream. The backward reference selection module 210, guided by the measurement statistics of the backward references and entropy coding data, refines 312 the backward references of the input data stream at a subsequent selection iteration. In addition to favoring backward references data which are common in the backward references at the subsequent iteration, the backward reference selection module 210 may evaluate the bit cost of backward references using formula (I) described above and further refine 312 the backward reference selection. The entropy coding module 240 encodes 306 the refined backward references. The backward reference selection control module 220 checks 308 again 205 whether a predetermined number of selection iterations are finished. Responsive to all selection iterations being performed, the backward reference module 200 outputs 314 the compressed data stream to a data storage medium or network for transmission over a computer network.

The above description is included to illustrate the operation of the preferred embodiments and is not meant to limit the scope of the invention. The scope of the invention is to be limited only by the following claims. From the above discussion, many variations will be apparent to one skilled in the relevant art that would yet be encompassed by the spirit and scope of the invention.

What is claimed is:

1. A method for selecting backward references for a data stream, the method comprising:
   receiving the data stream, the data stream comprising a plurality of blocks of data elements;
   performing a plurality of backward reference selection iterations to select backward references for the blocks of data elements;
   generating a statistical model of the distribution of backward reference distances and lengths based on the selected backward references;
   selectively encoding the blocks of data elements based on the statistical model to select backward references that minimize entropy;
   compressing the data elements; and
   storing the compressed data elements in a non-transitory computer-readable storage medium.

2. The method of claim 1, wherein each backward reference has a backward reference distance and backward reference length, and wherein selecting a backward reference for a block of data elements comprises selecting a backward reference with a backward reference distance that is shorter than another backward reference having identical backward reference length.

3. The method of claim 1, wherein the statistical model of the backward references comprises a plurality of distribution models for a plurality of backward references, each distribution model indicating the distribution of backward reference distances and backward reference lengths of the plurality of backward references.

4. The method of claim 3, wherein the distribution of a backward reference represents a number of backward references having the same backward reference length and distance.

5. The method of claim 1, wherein generating a statistical model of the distribution of backward reference distances and lengths comprises recalculating the distribution of the backward reference distances and backward reference lengths at each iteration.

6. The method of claim 1, wherein selectively encoding the blocks of data based on the statistical model comprises selecting a backward reference for a block of data elements favoring a common backward reference among the backward references.

7. A method for optimizing Deflate data compression of a data stream through backward reference selection iterations, the method comprising:
   receiving the data stream, the data stream comprising a plurality of blocks of data elements;
   performing a plurality of backward reference selection iterations to select backward references for the blocks of data elements;
   entropy encoding the blocks of data elements with selected backward references, each backward reference being associated with a block of data elements;
   generating a statistical model of the distribution of backward reference distances, lengths and entropy encoded data based on the selected backward references;
   selectively encoding the blocks of data elements based on the statistical model to select backward references that minimize entropy;
   compressing the data elements; and
   storing the compressed data elements in a non-transitory computer-readable storage medium.

8. The method of claim 7, wherein the statistic model comprises a plurality of distribution models, each distribution model indicating the distribution of a type of entropy encoded data.

9. The method of claim 8, wherein the entropy encoded data comprises backward reference distance prefix and backward reference length prefix.

10. The method of claim 7, wherein selectively encoding the blocks of data elements based on the statistical model comprises selecting a backward reference for a block of data elements favoring a common backward reference prefix among the previously generated backward reference prefixes.

11. The method of claim 7, wherein the entropy encoding is Huffman encoding.

12. A system for selecting backward references for a data stream, the system comprising:
   an uncompressed data buffer configured to receive the data stream, the data stream comprising a plurality of blocks of data elements;
   a selection module configured to perform at least one of backward reference selection iterations to select backward references for the blocks of data elements;
   an analyzing module configured to generate a statistical model of the distribution of backward reference distances and lengths based on the selected backward references; and
   an encoding module configured to selectively encode the blocks of data elements based on the statistical model to select backward references that minimize entropy, compress the data elements, and store the compressed data elements in a non-transitory computer-readable storage medium.

13. The system of claim 12, wherein each backward reference has a backward reference distance and backward reference length, and wherein the selection module is configured to select a backward reference with a backward reference distance that is shorter than another backward reference having identical backward reference length.

14. The system of claim 12, wherein the statistical model of the backward references comprises a plurality of distribution models for a plurality of backward references, each distribution model indicating the distribution of backward reference distances and backward reference lengths of the plurality of backward references.

15. The system of claim 14, wherein the distribution of a backward reference represents a number of backward references having the same backward reference length and distance.

16. The system of claim 12, wherein the analyzing module is configured to recalculate the distribution of the backward reference distances and backward reference lengths at each iteration.

17. The system of claim 12, wherein the encoding module is configured to select a backward reference for a block of data elements favoring a common backward reference among the backward references.

18. A system for optimizing Deflate data compression of a data stream through backward reference selection iterations, the system comprising:
   an uncompressed data buffer configured to receive the data stream, the data stream comprising a plurality of blocks of data elements;
   a selection module configured to perform a plurality of backward reference selection iterations to select backward references for the blocks of data elements;
   an entropy encoding module configured to entropy encode the blocks of data elements with selected backward references, each backward reference being associated with a block of data elements;
   an analyzing module configured to generate a statistical model of the distribution of backward reference distances, lengths and entropy encoded data based on the selected backward references; and
   an encoding module configured to selectively encode the blocks of data elements based on the statistical model to select backward references that minimize entropy, compress the data elements, and store the compressed data elements in a non-transitory computer-readable storage medium.

19. The system of claim 18, wherein the statistic model comprises a plurality of distribution models, each distribution model indicating the distribution of a type of entropy encoded data.

20. The system of claim 19, wherein the entropy encoded data comprise backward reference distance prefix and backward reference length prefix.

21. The system of claim 18, wherein the encoding module is configured to selectively encoding the blocks of data elements based on the statistical model comprises selecting a backward reference for a block of data elements favoring a common backward reference prefix among the previously generated backward reference prefixes.

22. The system of claim 18, wherein the entropy encoding is Huffman encoding.

23. A method for selecting backward references for a data stream, the method comprising:
   receiving the data stream, the data stream comprising a plurality of blocks of data elements;
   performing a single backward reference selection iteration to select backward references for the blocks of data elements;
   generating a statistical model of the distribution of backward reference distances and lengths based on the selected backward references from the single backward reference iteration; and
   selectively encoding the blocks of data elements based on the statistical model to select backward references that minimize entropy;
   compressing the data elements; and
   storing the compressed data elements in a non-transitory computer-readable storage medium.

24. The method of claim 23, wherein the distribution of backward reference distances and lengths includes only the distribution of backward reference distances and lengths being processed by the backward reference selection iteration.

25. A non-transitory computer-readable storage medium storing executable computer modules for selecting backward references for a data stream, comprising:
   an uncompressed data buffer configured to receive the data stream, the data stream comprising a plurality of blocks of data elements;
   a selection module configured to perform at least one of backward reference selection iterations to select backward references for the blocks of data elements;
   an analyzing module configured to generate a statistical model of the distribution of backward reference distances and lengths based on the selected backward references; and
   an encoding module configured to selectively encode the blocks of data elements based on the statistical model to select backward references that minimize entropy, wherein encoding the blocks of data elements comprises compressing the data elements and storing the compressed data elements in the non-transitory computer-readable storage medium.

26. The computer-readable storage medium of claim 25, wherein each backward reference has a backward reference distance and backward reference length, and wherein the selection module is configured to select a backward reference with a backward reference distance that is shorter than another backward reference having identical backward reference length.

27. The computer-readable storage medium of claim 25, wherein the statistical model of the backward references comprises a plurality of distribution models for a plurality of backward references, each distribution model indicating the distribution of backward reference distances and backward reference lengths of the plurality of backward references.

28. The computer-readable storage medium of claim 27, wherein the distribution of a backward reference represents a number of backward references having the same backward reference length and distance.

29. The computer-readable storage medium of claim 25, wherein the analyzing module is configured to recalculate the distribution of the backward reference distances and backward reference lengths at each iteration.

30. The computer-readable storage medium of claim 25, wherein the encoding module is configured to select a backward reference for a block of data elements favoring a common backward reference among the backward references.

31. A non-transitory computer-readable storage medium storing executable computer modules for optimizing Deflate data compression of a data stream through backward reference selection iterations, comprising:
   an uncompressed data buffer configured to receive the data stream, the data stream comprising a plurality of blocks of data elements;
   a selection module configured to perform a plurality of backward reference selection iterations to select backward references for the blocks of data elements;
   an entropy encoding module configured to entropy encode the blocks of data elements with selected backward references, each backward reference being associated with a block of data elements;
   an analyzing module configured to generate a statistical model of the distribution of backward reference distances, lengths and entropy encoded data based on the selected backward references; and
   an encoding module configured to selectively encode the blocks of data elements based on the statistical model to select backward references that minimize entropy, compress the data elements, and store the compressed data elements in a non-transitory computer-readable storage medium.

32. The computer-readable storage medium of claim 30, wherein the statistic model comprises a plurality of distribution models, each distribution model indicating the distribution of a type of entropy encoded data.

33. The computer-readable storage medium of claim 31, wherein the entropy encoded data comprise backward reference distance prefix and backward reference length prefix.

34. The computer-readable storage medium of claim 30, wherein the encoding module is configured to selectively encoding the blocks of data elements based on the statistical model comprises selecting a backward reference for a block of data elements favoring a common backward reference prefix among the previously generated backward reference prefixes.

* * * * *